US012666909B2

(12) United States Patent
Kim et al.

(10) Patent No.: US 12,666,909 B2
(45) Date of Patent: Jun. 23, 2026

(54) APPARATUS FOR MANUFACTURING SEMICONDUCTOR DEVICE AND METHOD FOR MANUFACTURING SEMICONDUCTOR DEVICE USING THE SAME

(71) Applicant: Samsung Electronics Co., Ltd., Suwon-si (KR)

(72) Inventors: Ji Hun Kim, Suwon-si (KR); Youn Gon Oh, Suwon-si (KR); Woo-Ram Moon, Suwon-si (KR); Sang Hyuk Park, Suwon-si (KR); Jong Hun Lee, Suwon-si (KR); Kyu-Sik Jeong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 235 days.

(21) Appl. No.: 18/484,562

(22) Filed: Oct. 11, 2023

(65) Prior Publication Data

US 2024/0128109 A1 Apr. 18, 2024

(30) Foreign Application Priority Data

Oct. 12, 2022 (KR) ........................ 10-2022-0130200

(51) Int. Cl.
*H01L 21/677* (2006.01)
*H10P 72/00* (2026.01)
*H10P 72/30* (2026.01)
*H10P 72/76* (2026.01)

(52) U.S. Cl.
CPC ...... *H10P 72/3202* (2026.01); *H10P 72/0606* (2026.01); *H10P 72/3208* (2026.01); *H10P 72/3221* (2026.01); *H10P 72/7618* (2026.01)

(58) Field of Classification Search
CPC ........... H01L 21/67733; H01L 21/6773; H10P 72/3221; H10P 72/3218
See application file for complete search history.

(56) References Cited

U.S. PATENT DOCUMENTS

| | | | |
|---|---|---|---|
| 9,305,815 B2 | 4/2016 | Tung et al. | |
| 2013/0195588 A1* | 8/2013 | Shibata ............. | H01L 21/67727 414/222.13 |
| 2013/0230375 A1* | 9/2013 | Tung ................. | H01L 21/67733 414/592 |
| 2018/0290832 A1* | 10/2018 | Izumi .................. | H01L 21/6773 |

(Continued)

FOREIGN PATENT DOCUMENTS

| | | |
|---|---|---|
| JP | 2015209185 A | 11/2015 |
| JP | 2018075936 A | 5/2018 |

(Continued)

*Primary Examiner* — Gerald McClain
(74) *Attorney, Agent, or Firm* — Wolf, Greenfield & Sacks, P.C.

(57) ABSTRACT

An apparatus for manufacturing a semiconductor device includes a substrate transfer unit configured to transfer a substrate, a rail unit including a driving rail extending in a first direction that the substrate transfer unit moves and a stopper on a side of the driving rail in a second direction crossing the first direction, and a lifting unit configured to move in the first direction and a third direction perpendicular to the first and second directions to remove the substrate transfer unit from the rail unit, wherein the lifting unit is configured to contact the stopper to move the stopper from a closed state to an open state.

20 Claims, 22 Drawing Sheets

(56)            References Cited

U.S. PATENT DOCUMENTS

2023/0365332 A1 * 11/2023 Wada ........................ B61B 3/02
2024/0051767 A1 * 2/2024 Kim .................. H01L 21/67736

FOREIGN PATENT DOCUMENTS

| | | | | |
|---|---|---|---|---|
| JP | 2019214438 A | 12/2019 | | |
| KR | 20060059220 A | 6/2006 | | |
| KR | 102235517 B1 | 4/2021 | | |
| KR | 20220000180 A | 1/2022 | | |
| KR | 20230147877 A | * 10/2023 | ......... H10P 72/3221 |
| KR | 10-2024-0020855 A | 2/2024 | | |

* cited by examiner

APPARATUS FOR MANUFACTURING SEMICONDUCTOR DEVICE AND METHOD FOR MANUFACTURING SEMICONDUCTOR DEVICE USING THE SAME

CROSS-REFERENCE TO RELATED APPLICATION

This application claims priority under 35 U.S.C. 119 from Korean Patent Application No. 10-2022-0130200, filed on Oct. 12, 2022 in the Korean Intellectual Property Office, the contents of which are herein incorporated by reference in their entirety.

FIELD

The present disclosure relates to an apparatus for manufacturing a semiconductor device and a method for manufacturing a semiconductor device using the same.

BACKGROUND

Generally, a semiconductor device may be manufactured by repeatedly performing a series of manufacturing processes for a substrate such as a silicon wafer. For example, the manufacturing processes may be performed in semiconductor manufacturing facilities to handle and carry a plurality of wafers.

In this case, the substrate may be provided to the facilities or taken back from the facilities by using a carrier, in which a plurality of substrates may be accommodated, for example, a Front Opening Unified Pod (FOUP), a Front Opening Shipping Box (FOSB), etc. Such a carrier may be generally transported by an Overhead Hoist Transport (OHT) disposed on a ceiling surface.

Meanwhile, when a failure occurs in the OHT, the failed OHT may be taken out using a maintenance lifter.

SUMMARY

An object of the present disclosure is to provide an apparatus for manufacturing a semiconductor device to efficiently perform maintenance and repair for an OHT.

Another object of the present disclosure is to provide a method for manufacturing a semiconductor device to efficiently perform maintenance and repair for an OHT.

The objects of the present disclosure are not limited to those mentioned above and additional objects of the present disclosure, which are not mentioned herein, will be clearly understood by those skilled in the art from the following description of the present disclosure.

An apparatus for manufacturing a semiconductor device according to some embodiments of the present disclosure includes a substrate transfer unit configured to transfer a substrate, a rail unit including a driving rail extending in a first direction that the substrate transfer unit moves and a stopper on a side of the driving rail in a second direction crossing the first direction, and a lifting unit configured to move in the first direction and a third direction perpendicular to the first and second directions to remove the substrate transfer unit from the rail unit, wherein the lifting unit is configured to contact the stopper to move the stopper from a closed state to an open state.

An apparatus for maintenance and repair of equipment in an apparatus for manufacturing a semiconductor device according to some embodiments of the present disclosure includes a ceiling driving system configured to transfer a carrier in which a substrate is accommodated, a rail system including a driving rail extending in a first horizontal direction that the ceiling driving system moves, a position adjustment block at an end portion of the driving rail in the first horizontal direction and first and second stoppers on opposite sides of the driving rail to face each other in a second horizontal direction crossing the first horizontal direction, a lifting system configured to remove the ceiling driving system from the rail system and including a position adjustment pin and a stopper open block, and a control unit configured to control movement of the lifting system, wherein the position adjustment pin is received at the position adjustment block in the first horizontal direction and the stopper open block moves in a third direction perpendicular to the first and second horizontal directions to contact the first and second stoppers.

A method for manufacturing a semiconductor device according to some embodiments of the present disclosure uses an apparatus for manufacturing a semiconductor device, which includes a rail unit including a stopper and a position adjustment block, a substrate transfer unit for driving along a ceiling surface and along the rail unit, and a lifting unit for moving the substrate transfer unit from the ceiling surface to a bottom surface, and includes moving the lifting unit to a first horizontal point where the substrate transfer unit is positioned, ascending the lifting unit toward the ceiling surface in a vertical direction until the lifting unit is sensed by a first sensor, moving the lifting unit to a second horizontal point spaced apart from the first horizontal point in a first horizontal direction, descending the lifting unit toward the bottom surface in the vertical direction until the lifting unit is sensed by a second sensor, positioning the lifting unit to correspond to an upper portion of the position adjustment block, descending the lifting unit so that the lifting unit and the stopper are in contact with each other to open the stopper, and removing the substrate transfer unit from the rail unit using the lifting unit.

Details of other embodiments are included in the detailed description and drawings.

BRIEF DESCRIPTION OF THE DRAWINGS

The above and other aspects and features of the present disclosure will become more apparent by describing in detail example embodiments thereof with reference to the attached drawings, in which:

FIG. 4B is an enlarged view illustrating a portion R1 of FIG. 4A;

FIGS. 5 and 6 are views illustrating a state that a stopper of an apparatus for manufacturing a semiconductor device according to some embodiments is closed;

FIGS. 9 to 18 are views illustrating a method for manufacturing a semiconductor device according to some embodiments.

DETAILED DESCRIPTION

Figure 1:
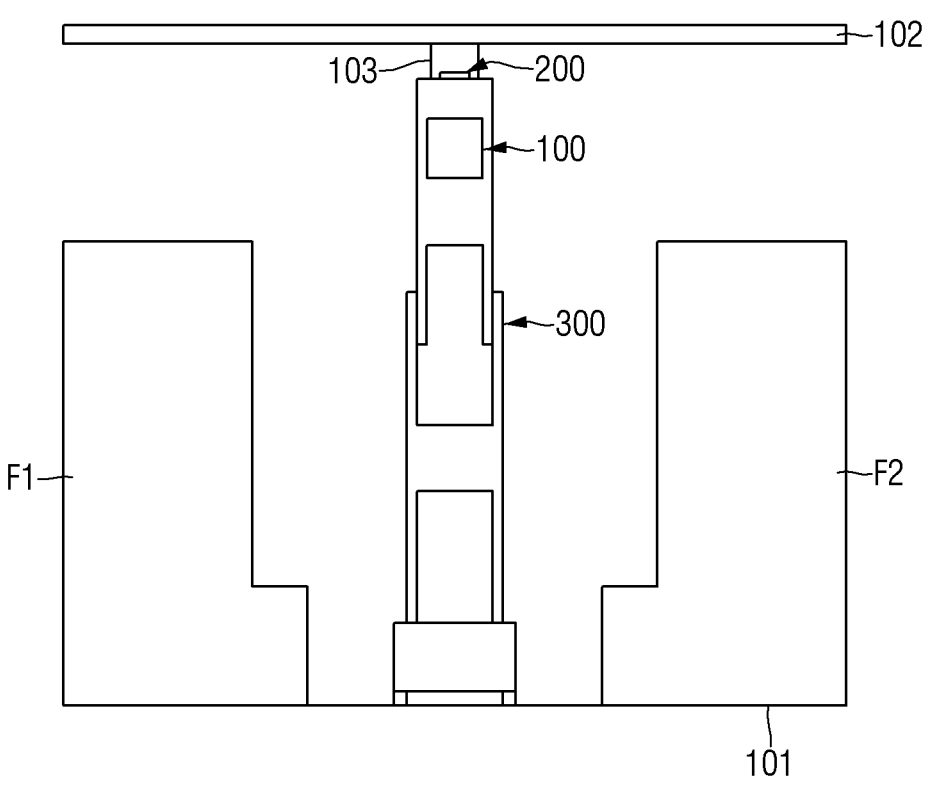
FIG. 1 is a schematic view illustrating an apparatus for manufacturing a semiconductor device according to some embodiments.
Figure 2:
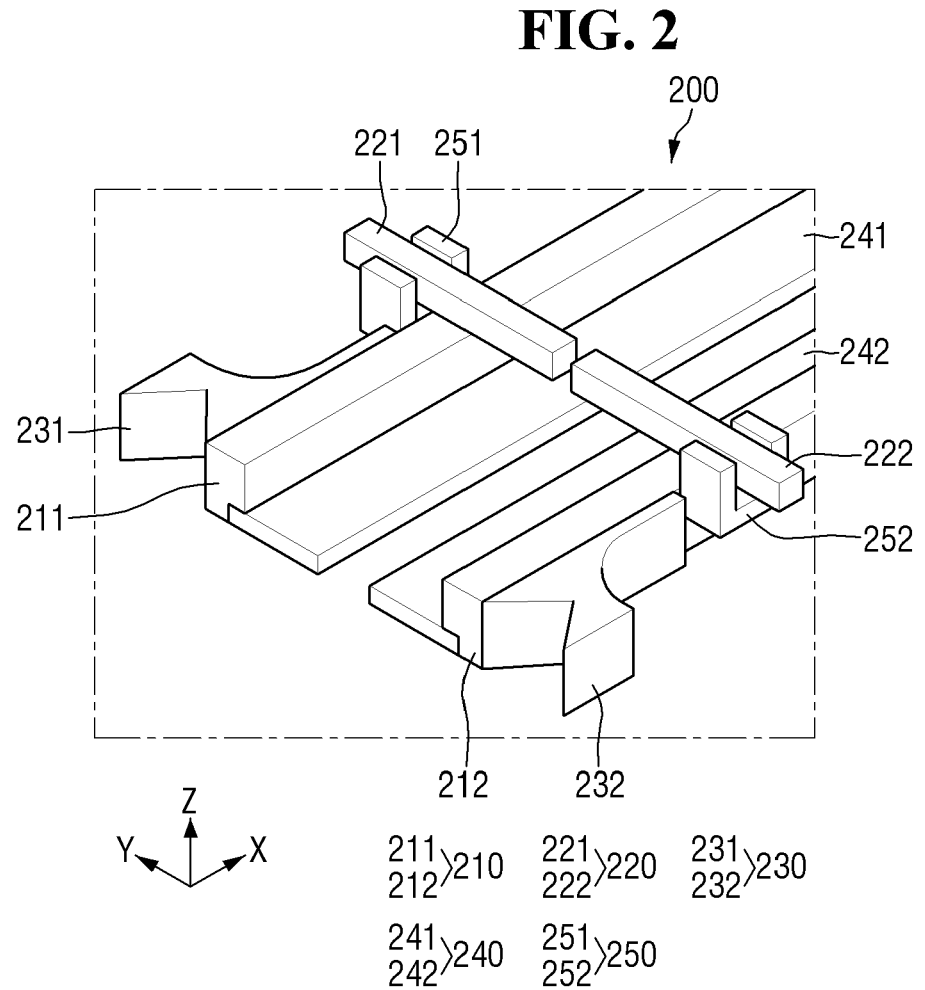
FIG. 2 is a view illustrating a rail unit of an apparatus for manufacturing a semiconductor device of FIG. 1.
Figure 3:
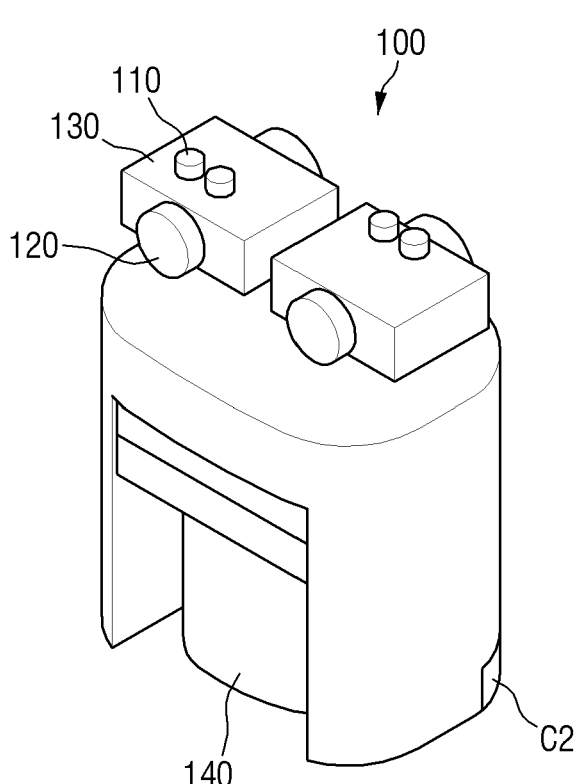
FIG. 3 is a view illustrating a substrate transfer unit of an apparatus for manufacturing a semiconductor device of FIG. 1.
Figure 4A:
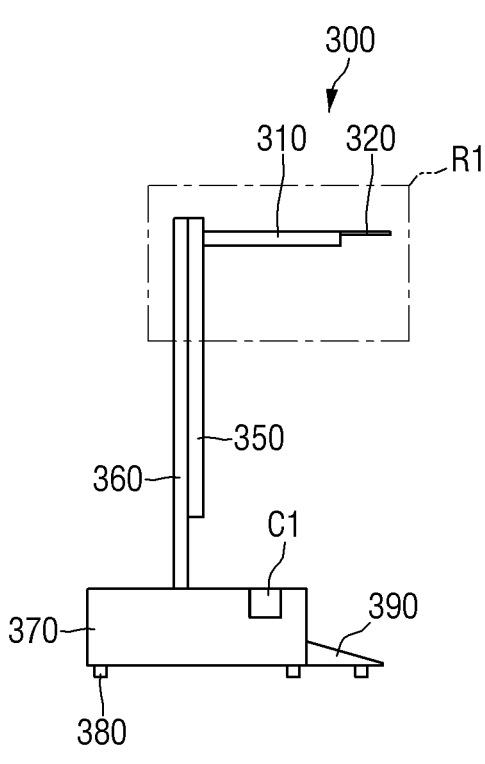
FIG. 4A is a view illustrating a lifting unit of an apparatus for manufacturing a semiconductor device of FIG. 1.
Figure 4B:
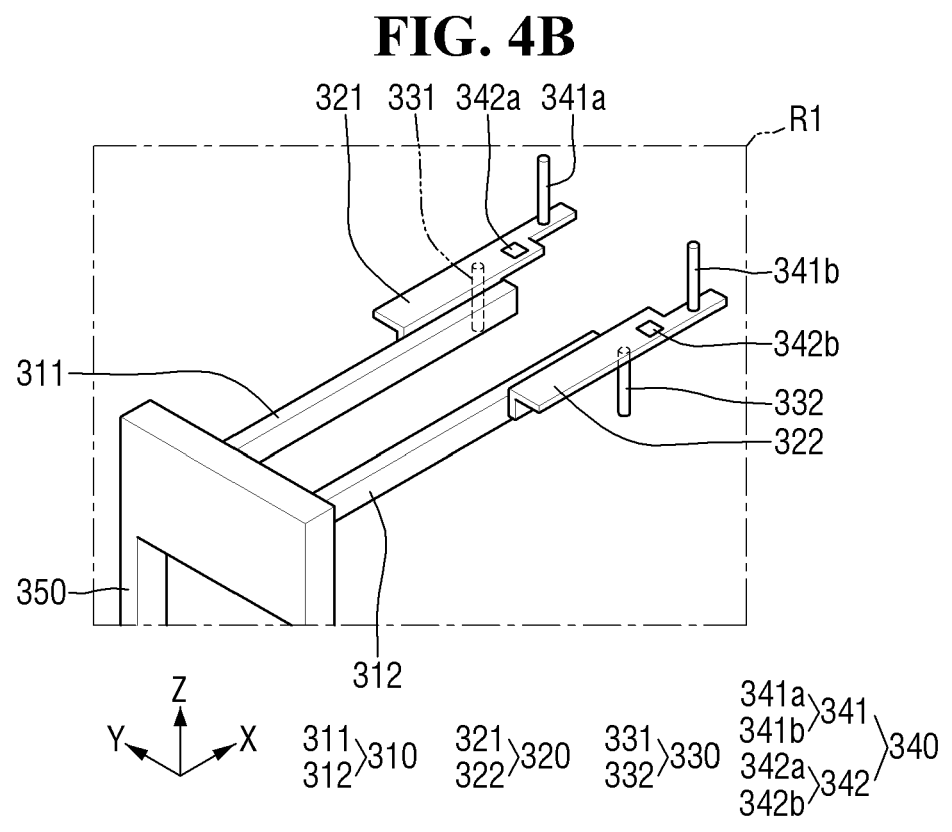

FIG. 1 is a schematic view illustrating an apparatus for manufacturing a semiconductor device according to some embodiments. FIG. 2 is a view illustrating a rail unit of an apparatus for manufacturing a semiconductor device of FIG. 1. FIG. 3 is a view illustrating a substrate transfer unit of an apparatus for manufacturing a semiconductor device of FIG. 1. FIG. 4A is a view illustrating a lifting unit of an apparatus for manufacturing a semiconductor device of FIG. 1. FIG. 4B is an enlarged view illustrating a portion R1 of FIG. 4A.

Referring to FIGS. 1 and 2, an apparatus 1000 for manufacturing a semiconductor device according to some embodiments may include a substrate transfer unit or substrate transfer system 100, a rail unit or rail system 200 and a lifting unit 300. The apparatus 1000 for manufacturing a semiconductor device according to some embodiments may have a bottom surface or lower surface 101 and a ceiling surface or upper surface 102, through which the substrate transfer unit 100 moves.

In some embodiments of the present disclosure, a first direction X refers to a horizontal direction in which a driving rail 210, which will be described below, extends. A second direction Y refers to a horizontal direction crossing the first direction X, and may be, for example, a direction perpendicular to the first direction X. A third direction Z refers to a vertical direction crossing each of the first and second directions X and Y, and may be, for example, an up and down direction (e.g., perpendicular to both the first direction X and the second direction Y).

The substrate transfer unit 100 may include a driving unit or driving system or driver for driving the ceiling surface 102 along the driving rail 210. A hoist unit or hoist for transporting a transfer target may be mounted on a lower portion of the driving unit.

Referring to FIG. 3, the driving unit may include a driving wheel 120 disposed on the driving rail 210, the driving unit 130 on which the driving wheel 120 is mounted, and a guide wheel 110 disposed on the driving unit 130, supporting and guiding the driving unit 130 at a divergence point. Although not shown in detail, the guide wheel 110 may be disposed on an actuating member configured to be movable in a left-right direction. Meanwhile, although not shown in detail, an additional sensor capable of measuring the amount of wear, surface exfoliation and crack of the guide wheel 110 may be included.

The hoist unit may include a carrier 140, in which a substrate is accommodated, for carrying the substrate between process facilities F1 and F2 in which a semiconductor process is performed.

The rail unit 200 may include a driving rail 210, a stopper 220, a position adjustment block 230, a cable support 240 and a stopper support 250.

The driving rail 210 may be connected to the ceiling surface 102 by a connection portion or connector 103. The driving rail 210 may provide a physical path through which the substrate transfer unit 100 moves. The driving rail 210 may include first and second driving rails 211 and 212 facing each other in the second direction Y.

The stopper 220 may be disposed on a side of the driving rail 210 in the second direction Y different from the first direction X.

The stopper 220 may include first and second stoppers 221 and 222 respectively disposed on both sides of the driving rail 210. The first and second stoppers 221 and 222 may be disposed to face each other in the second direction Y.

The position adjustment block 230 may adjust a position where the stopper 220 and the lifting unit 300 are in contact with each other, in the first and second directions X and Y. The position adjustment block 230 may be disposed at an end portion of the driving rail 210 in the first direction X.

The position adjustment block 230 may include first and second position adjustment blocks 231 and 232 respectively disposed on both sides of the driving rail 210. The first and second position adjustment blocks 231 and 232 may be disposed to face each other in the second direction Y.

The cable support 240 may support a cable for supplying a power source to the substrate transfer unit 100. Although not shown in detail, the cable may be disposed below the rail unit 200.

The cable support 240 may include first and second cable supports 241 and 242 disposed on both sides of the driving rail 210, respectively. The first and second cable supports 241 and 242 may be disposed to face each other in the second direction Y.

The stopper support 250 may support the stopper 220 at the side of the driving rail 210. The stopper support 250 may include first and second stopper supports 251 and 252 respectively disposed on both sides of the driving rail 210. The first and second stopper supports 251 and 252 may be disposed to face each other in the second direction Y.

The lifting unit 300 may take out the substrate transfer unit 100 from the rail unit 200. In some embodiments, the lifting unit 300 may be a maintenance lifter used for maintenance and repair of the substrate transfer unit 100 in which a failure occurs, but the disclosure is not limited thereto.

Referring to FIGS. 4A and 4B, the lifting unit 300 may include a stopper open block support 310, a stopper open block 320, a position adjustment pin 330, a sensor 340, an ascending/descending portion or member 350, a support 360, a body portion 370, a moving portion or member 380 and a fixing portion 390.

The stopper open block support 310 may support the stopper open block 320 so that the stopper open block 320, which will be described below, moves on the driving rail 210.

The stopper open block support 310 may include first and second stopper open block supports 311 and 312 disposed to correspond to both sides of the driving rail 210, respectively. The first and second stopper open block supports 311 and 312 may be disposed to face each other in the second direction Y.

The stopper open block 320 may contact the stopper 220 to open the stopper 220.

The stopper open block 320 may include first and second stopper open blocks 321 and 322 disposed to correspond to both sides of the driving rail 210, respectively. The first and second stopper open blocks 321 and 322 may be disposed to face each other in the second direction Y.

The first and second stopper open blocks 321 and 322 may correspond to the first and second stoppers 221 and 222, respectively.

The position adjustment pin 330 may adjust a contact position with the stopper 220 in the first direction X and/or the second direction Y.

The position adjustment pin 330 may include first and second position adjustment pins 331 and 332 disposed to correspond to both sides of the driving rail 210, respectively.

The first and second position adjustment pins 331 and 332 may be disposed to face each other in the second direction Y.

The first and second position adjustment pins 331 and 332 may correspond to and be received at the first and second position adjustment blocks 231 and 232, respectively.

The sensor 340 may include a first sensor 341 for sensing a height ascending in the third direction Z and a second sensor 342 for sensing a height descending in the third direction Z. For example, the first sensor 341 may be a sensor for preventing the lifting unit 300 from excessively ascending toward the ceiling surface 102 (and may sense proximity to the ceiling surface 102). The second sensor 342 may be a sensor for preventing the lifting unit 300 from excessively descending when the lifting unit 300 is docking the driving rail 210 (and may sense proximity to the driving rail 210).

The first sensor 341 may include sensors 341a and 341b disposed to correspond to both sides of the driving rail 210, respectively. The sensors 341a and 341b may be disposed to face each other in the second direction Y. Each of the sensors 341a and 341b may be formed to be protruded from or extend from upper surfaces of the first and second stopper open blocks 321 and 322 a predetermined height.

The second sensor 342 may include sensors 342a and 342b disposed to correspond to both sides of the driving rail 210, respectively. The sensors 342a and 342b may be disposed to face each other in the second direction Y. The sensors 342a and 342b may be formed on the upper surfaces of the first and second stopper open blocks 321 and 322, respectively. In this case, the heights of the first sensor 341 and the second sensor 342 may be different from each other, but the disclosure is not limited thereto.

The first and second sensors 341 and 342 may be sensors for measuring a distance between the ceiling surface 102 and the stopper open block 320. For example, the first and second sensors 341 and 342 may be laser sensors. Although not shown in detail, each of the first and second sensors 341 and 342 may include a light transmitting unit for irradiating transmissive light toward a target, and a light receiving unit for receiving reflective light reflected from the target. Therefore, each of the first and second sensors 341 and 342 may measure displacement from each of the first and second sensors 341 and 342 to the target.

The ascending/descending portion 350 may be supported by the support 360 to ascend or descend in the third direction Z.

The body portion 370 may support the ascending/descending portion 350 and the support 360 from a lower portion. The fixing portion 390 may fix the body portion 370 to the bottom surface 101. The fixing portion 390 may be protruded to the outside of the body portion 370 in some cases to fix the body portion 370 to the bottom surface 101.

The moving portion 380 may move the ascending/descending portion 350 in the first direction X or the second direction Y on the bottom surface 101 below the body portion 370. For example, the moving portion 380 may be or include a wheel, but the disclosure is not limited thereto.

The apparatus 1000 for manufacturing a semiconductor device according to some embodiments may further include a first controller C1 for controlling movement of the lifting unit 300. The movement of the lifting unit 300 in the first and second directions X and Y may be controlled by the first controller C1. In addition, the movement of the lifting unit 300 in the third direction Z may be controlled by the first controller C1. Meanwhile, the first controller C1 may be on the lifting unit 300 as shown in FIG. 4A, and/or may be controlled by a worker, but the disclosure is not limited thereto.

The apparatus 1000 for manufacturing a semiconductor device according to some embodiments may further include a second controller C2 for controlling movement of the substrate transfer unit 100. The second controller C2 may be on the substrate transfer unit 100 as shown in FIG. 3 and/or may be disposed to be adjacent to the ceiling surface 102, but the disclosure is not limited thereto. Driving and substrate transfer work between facilities F1 and F2 of the substrate transfer unit 100 may be controlled by the second controller.

Figure 5:
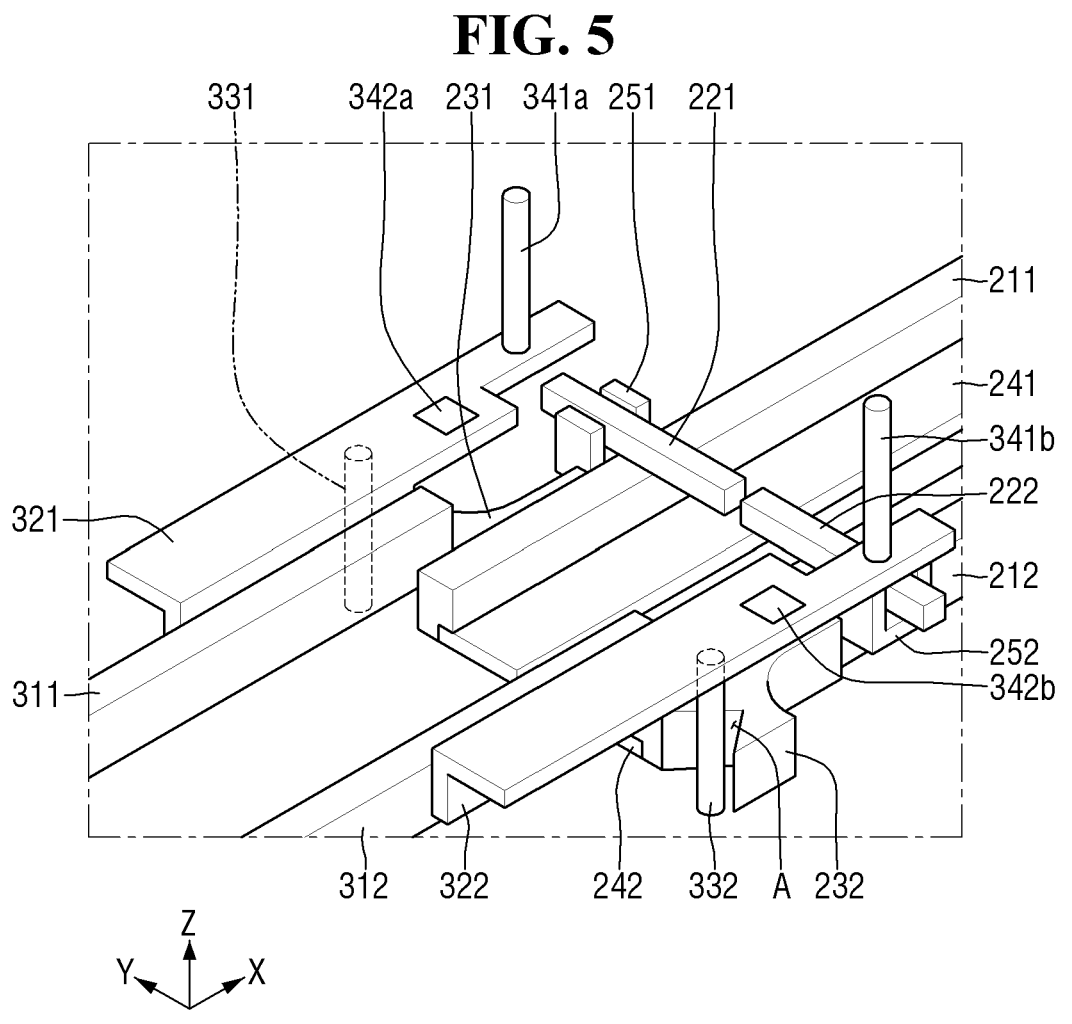
Figure 6:
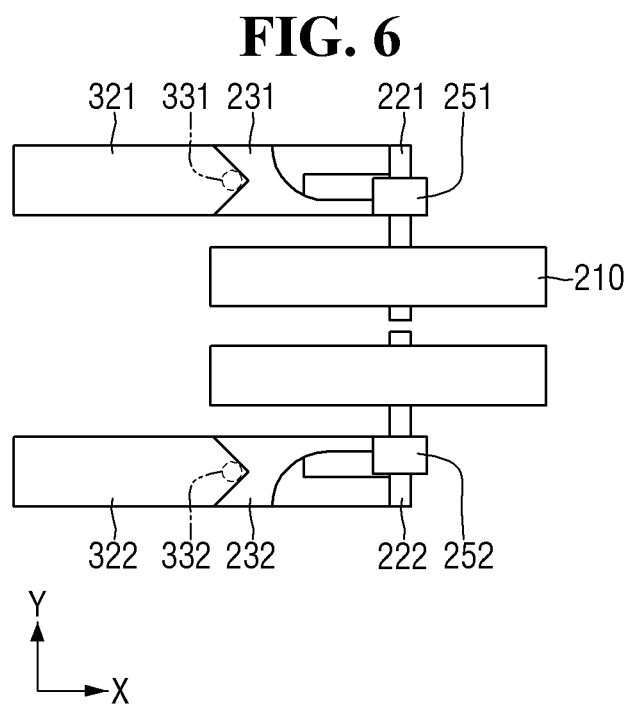
Figure 7:
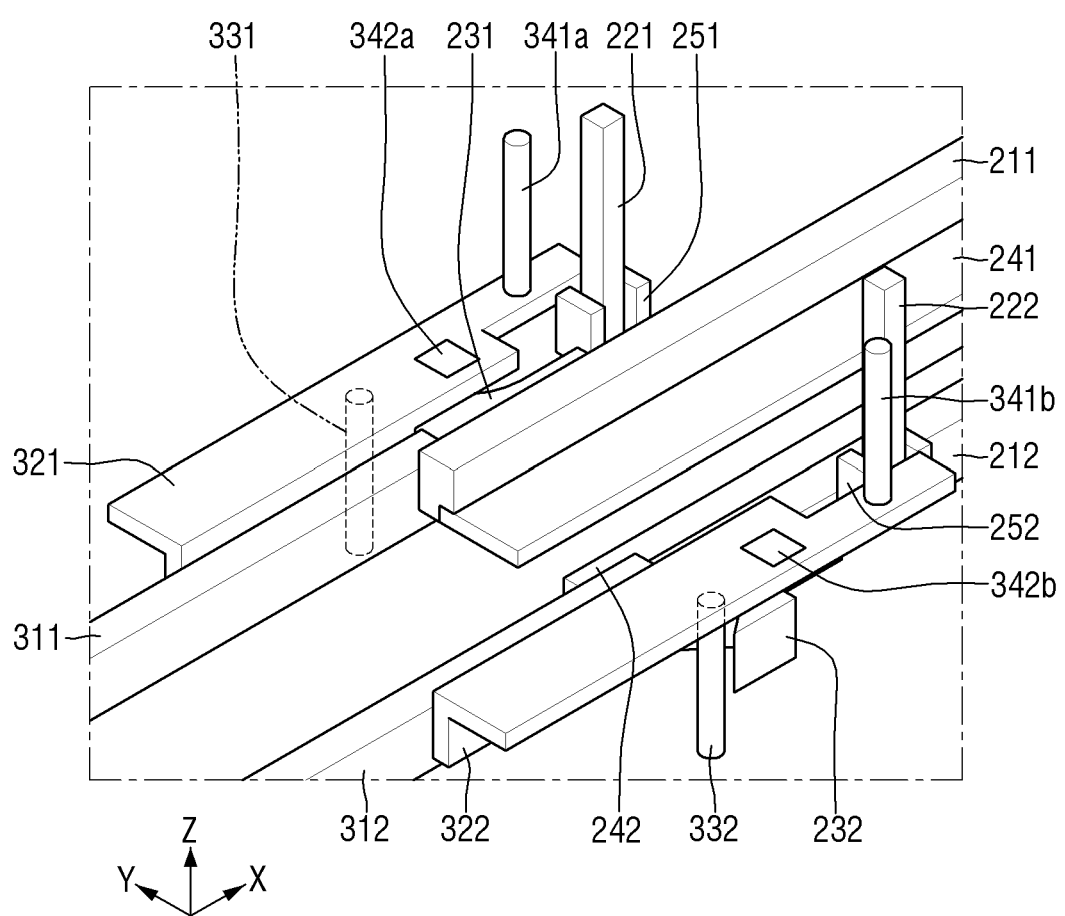
FIGS. 7 and 8 are views illustrating a state that a stopper of an apparatus for manufacturing a semiconductor device according to some embodiments is open.
Figure 8:
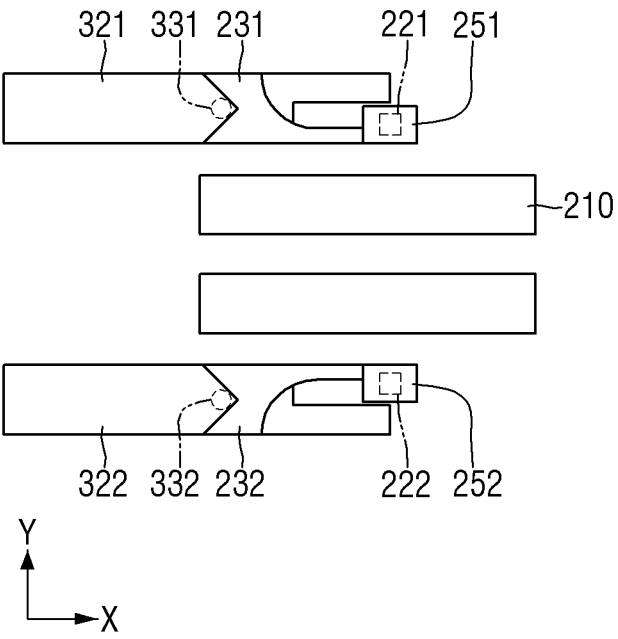

FIGS. 5 and 6 are views illustrating a state that a stopper of an apparatus for manufacturing a semiconductor device according to some embodiments is closed. FIGS. 7 and 8 are views illustrating a state that a stopper of an apparatus for manufacturing a semiconductor device according to some embodiments is open. For convenience of description and in the interest of brevity, the description repeated with that made with reference to FIGS. 1 to 4 may be omitted. For reference, FIGS. 6 and 8 are views illustrating that the lifting unit 300 and the rail unit 200 are viewed from a lower portion or below.

Referring to FIGS. 5 and 6, as the lifting unit 300 moves from an upper portion of the rail unit 200 in the first direction X, the position adjustment pin 330 may be disposed to correspond to or be received at the position adjustment block 230.

In detail, each of the first and second position adjustment blocks 231 and 232 may include a concave portion or a recess or a notch A recessed inward along the first direction X. As the lifting unit 300 moves in the first direction X, the first and second position adjustment pins 331 and 332 may be disposed to correspond to or be received in the concave portions A, respectively.

Referring to FIGS. 7 and 8, as the lifting unit 300 descends in the third direction Z, the stopper open block 320 and the stopper 220 are in contact with each other, so that the stopper 220 may be opened. In some embodiments, the opening of the stopper 220 may mean that the first and second stoppers 221 and 222 disposed in a direction parallel with the second direction Y are disposed in a direction parallel with the third direction Z. When the stopper 220 is open, the substrate transfer unit 100 may move on the driving rail 210.

That is, when the stopper 220 is opened by the contact between the stopper 220 and the lifting unit 300, the substrate transfer unit 100 may be taken out from the rail unit 200 by the lifting unit 300.

Figure 19A:
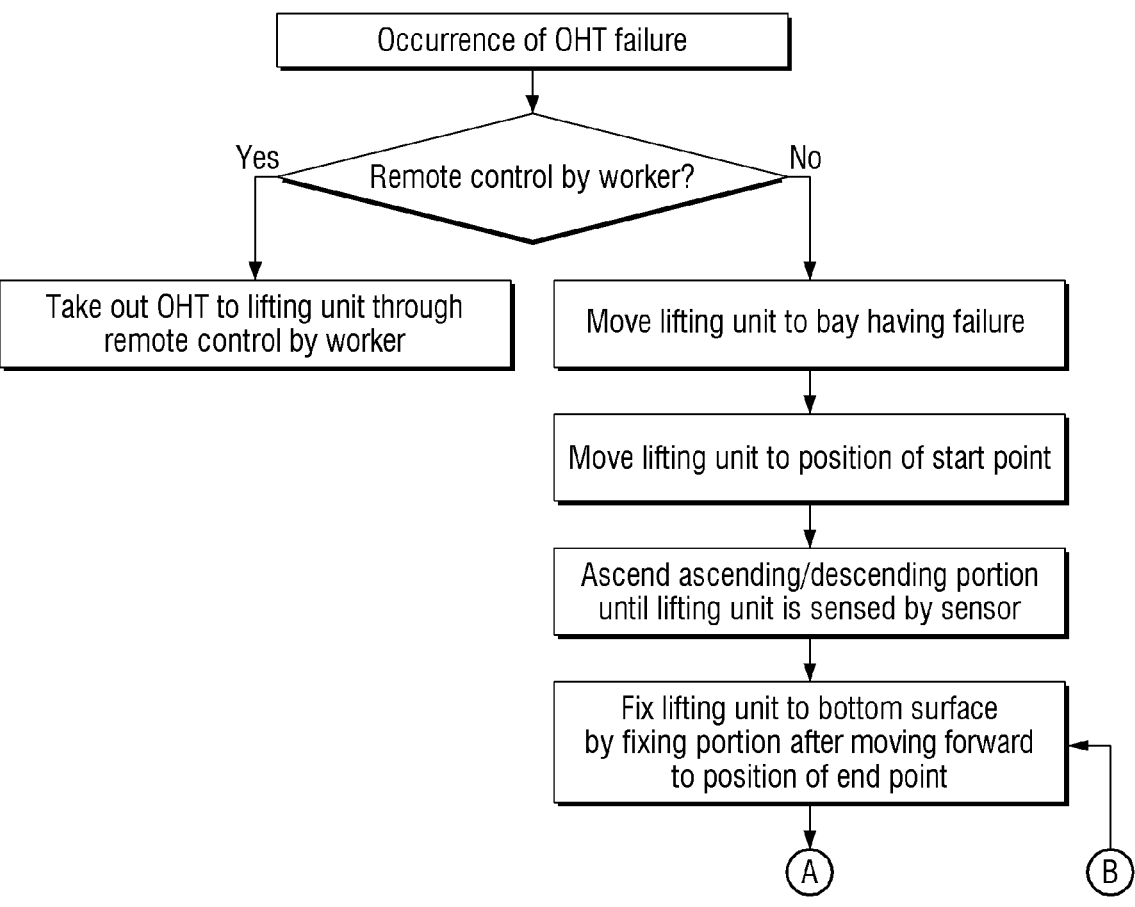
FIGS. 19A to 19C are flow charts illustrating a method for manufacturing a semiconductor device according to some embodiments.
Figure 19B:
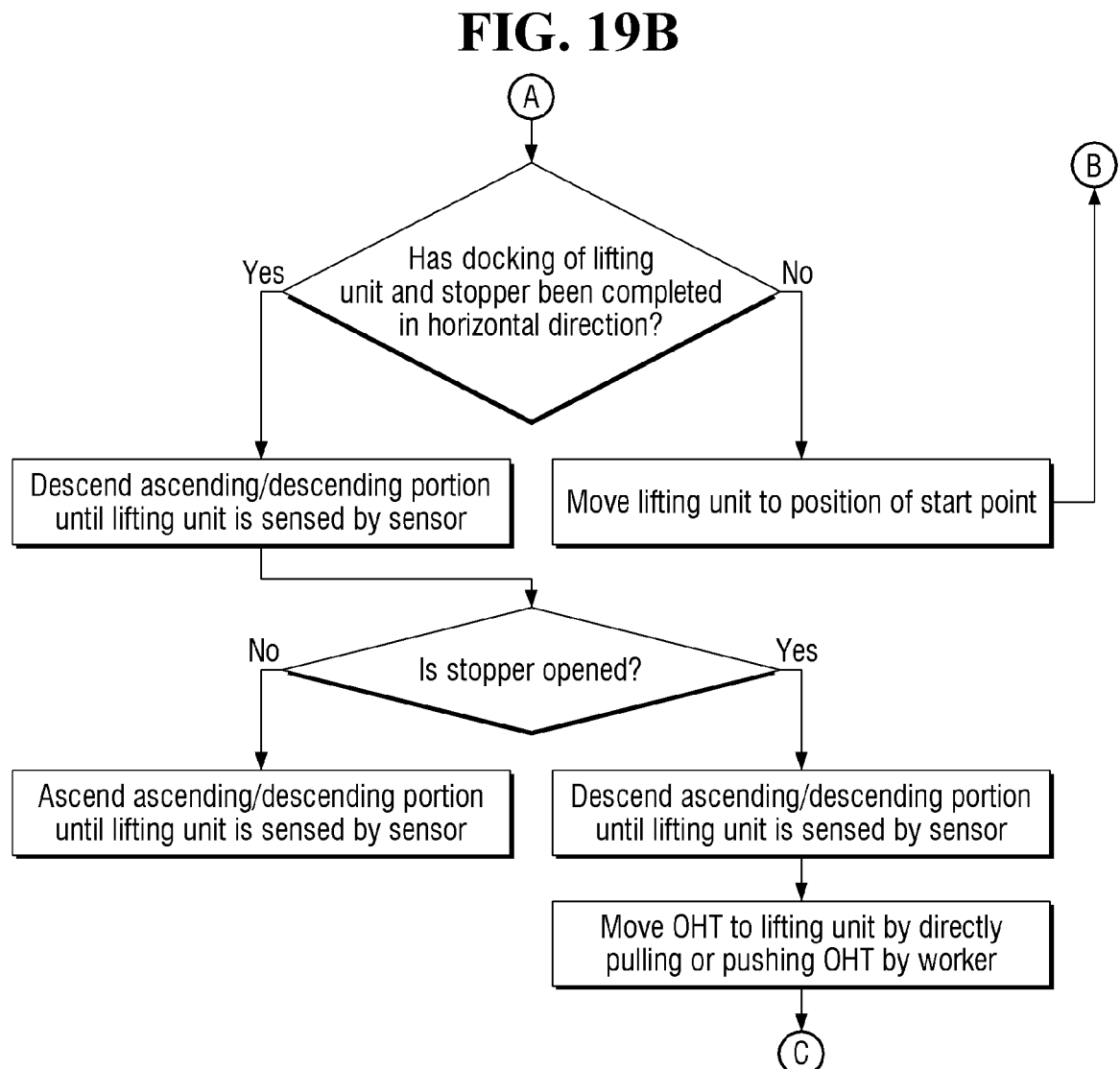
Figure 19C:
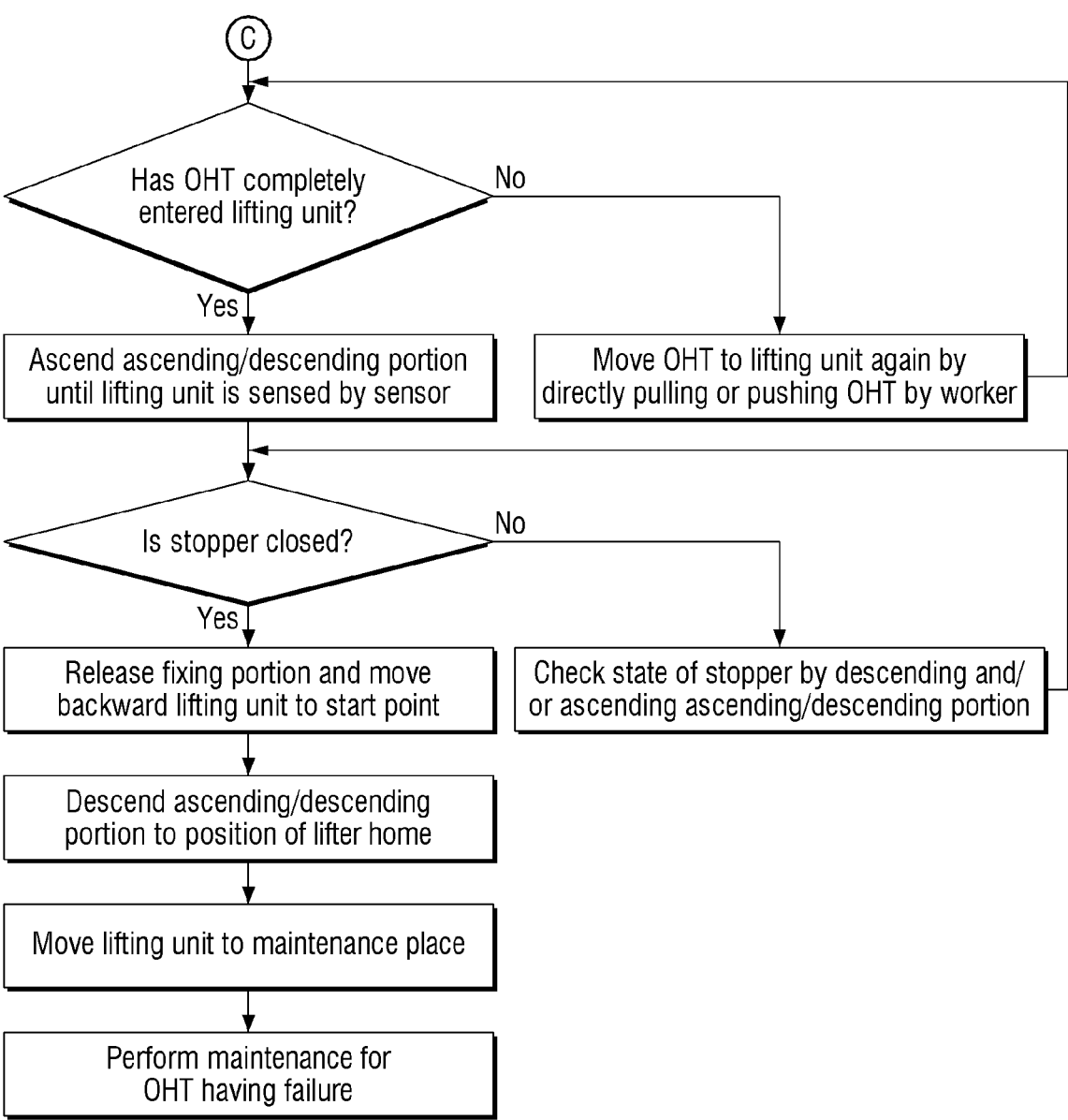

FIGS. 9 to 18 are views illustrating a method for manufacturing a semiconductor device according to some embodiments. FIGS. 19A to 19C are flow charts illustrating a method for manufacturing a semiconductor device according to some embodiments. For convenience of description and in the interest of brevity, the description repeated with that made with reference to FIGS. 1 to 8 may be omitted.

Referring to FIG. 19A, when a failure occurs in the substrate transfer unit 100, it may be determined whether the substrate transfer unit is remotely controlled by a worker. When the substrate transfer unit is remotely controlled by the worker, the substrate transfer unit 100 may be taken out to the lifting unit 300 by a remote control. When the substrate transfer unit 100 is not remotely controlled by the worker, the substrate transfer unit 100 may be taken out by the movement of the lifting unit 300 as follows.

Figure 9:
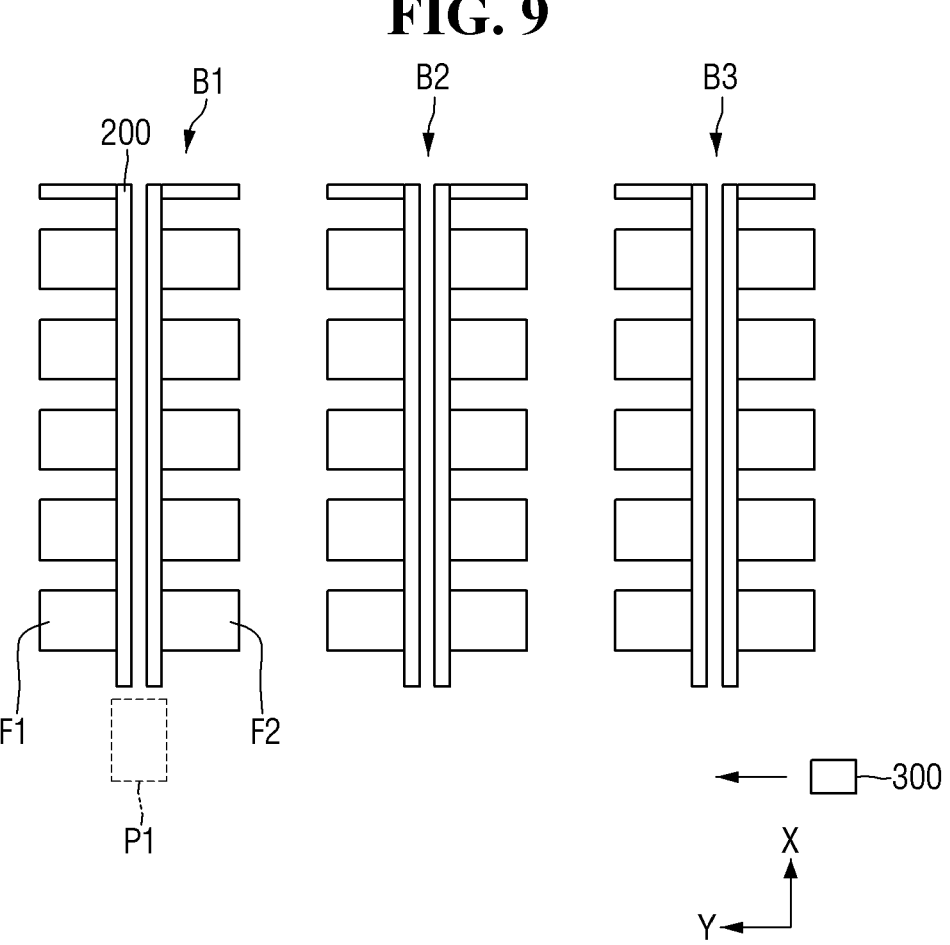

Referring to FIGS. 9 and 19A, the lifting unit 300 may move to a bay B1, in which the substrate transfer unit 100 having a failure is present, among a plurality of bays B1, B2 and B3. In some embodiments, the bay may refer to a space between facilities in which the same semiconductor process is performed, but the disclosure is not limited thereto.

Figure 10:
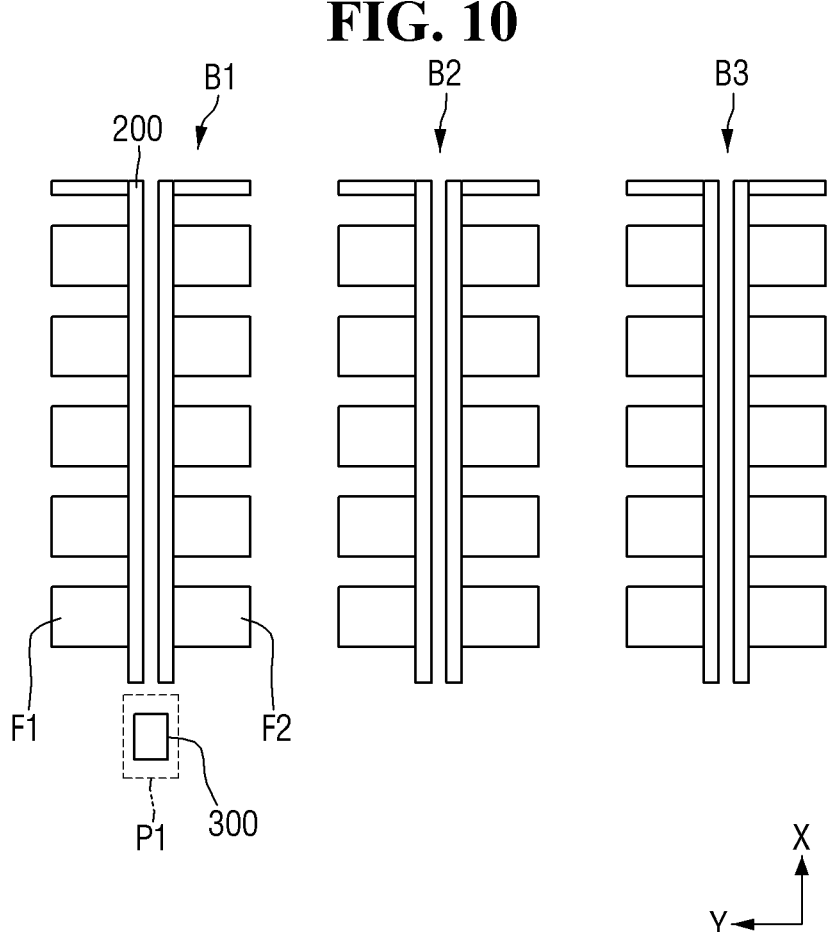

Referring to FIGS. 10 and 19A, the lifting unit 300 may move to a first region P1 in which the substrate transfer unit 100 having a failure is positioned. The first region P1 may mean a region where a first point SP, that is, a start point is positioned. The first point SP may be marked on the bottom surface 101.

Figure 11:
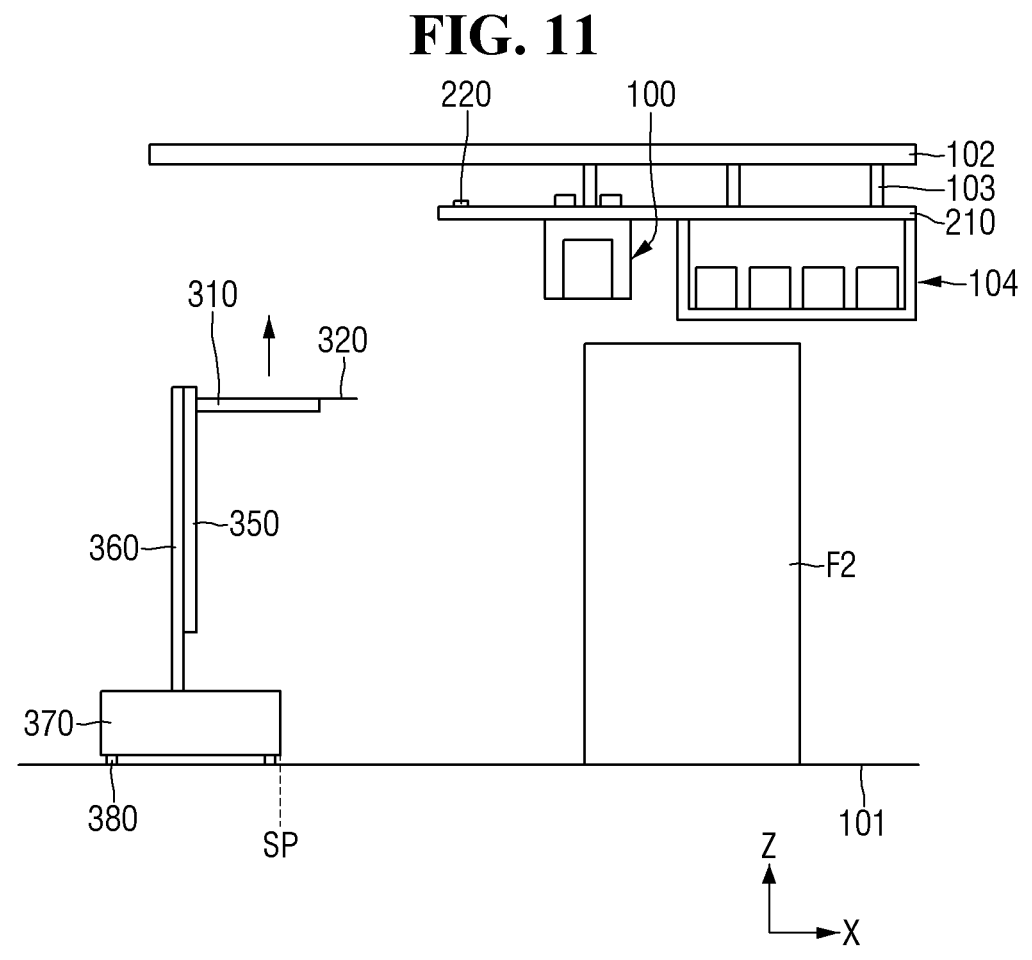

Referring to FIGS. 11 and 19A, the lifting unit 300 may ascend in the vertical direction Z toward the ceiling surface 102 until the lifting unit 300 or the ceiling surface 102 is sensed by the first sensor 341. Afterwards, the lifting unit 300 may descend as much as a predetermined height. For example, the predetermined height at which the lifting unit 300 descends may be about 50 mm, but the disclosure is not limited thereto.

Figure 12:
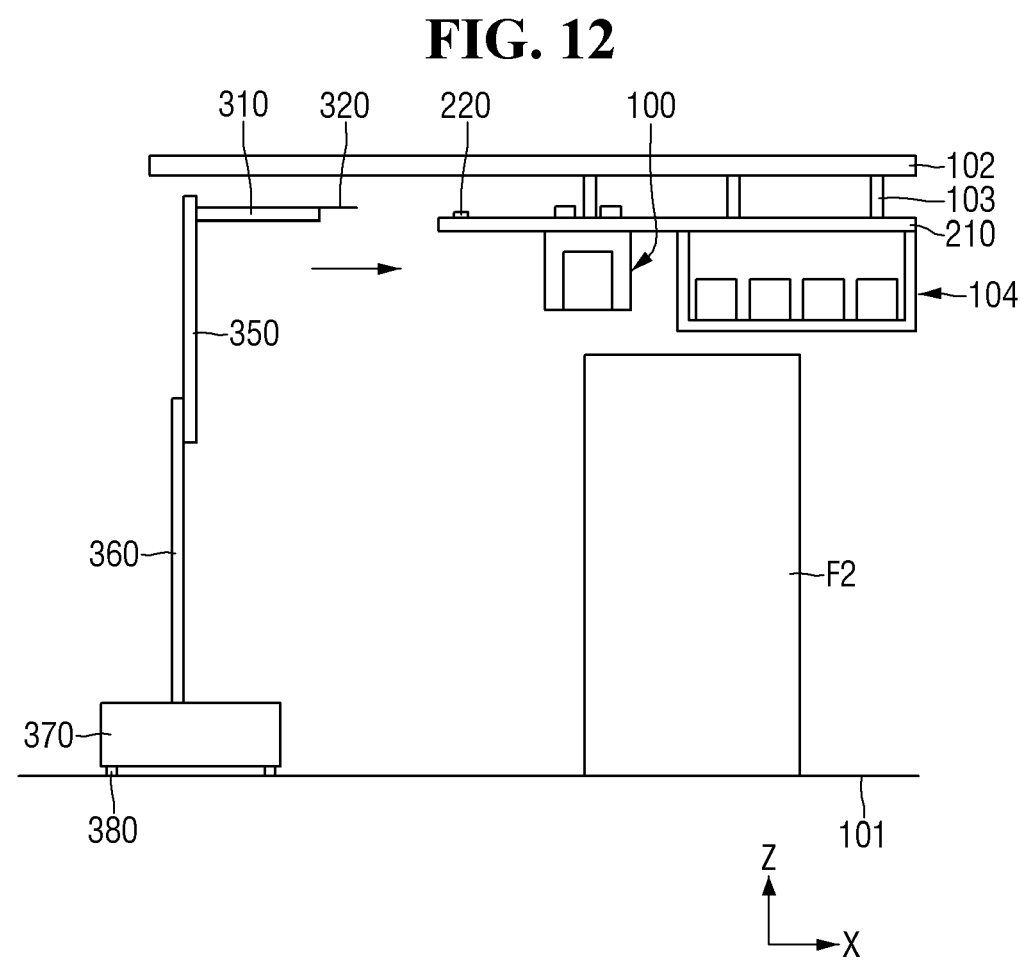
Figure 13:
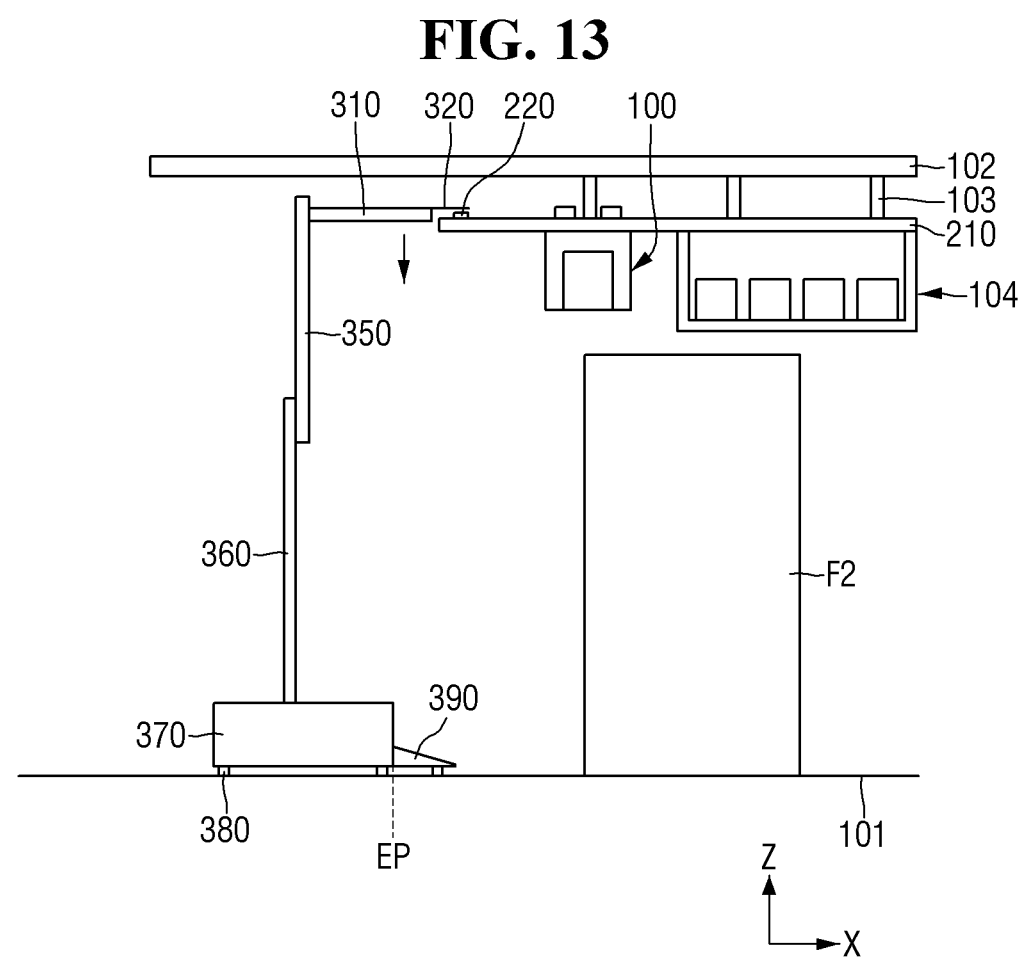

Referring to FIGS. 12 and 13 and 19A, the lifting unit 300 may move forward to a second point EP spaced apart from the first point SP in the first direction X. Therefore, the lifting unit 300 may move to be closer to the rail unit 200 on which the substrate transfer unit 100 and a substrate loading unit 104 are disposed.

Afterwards, the body portion 370 may be fixed to the bottom surface 101 by the fixing portion 390.

Referring to FIG. 19B, after the body portion 370 is fixed to the bottom surface 101, it is possible to determine whether docking of the lifting unit 300 and the stopper 220 has been completed in the first direction X and/or the second direction Y (A).

The lifting unit 300 may be disposed to correspond to an upper portion of the position adjustment block 230 in the first direction X and/or the second direction Y. That is, as described with reference to FIGS. 5 and 6, before the lifting unit 300 and the stopper 220 are in contact with each other, the position where the lifting unit 300 and the stopper 220 are in contact with each other may be adjusted.

When docking has not been completed, the position of the lifting unit 300 may be adjusted again. That is, the lifting unit 300 moves back to the second point EP and then may be fixed to the bottom surface 101 again (B).

When docking has been completed, the ascending/descending portion 350 may descend in the vertical direction Z toward the bottom surface 101 until the ascending/descending portion 350 is sensed by the second sensor 342 or is in contact with a descending stopper. That is, as described in FIGS. 7 and 8, the lifting unit 300 and the stopper 220 may be in contact with each other.

Figure 14:
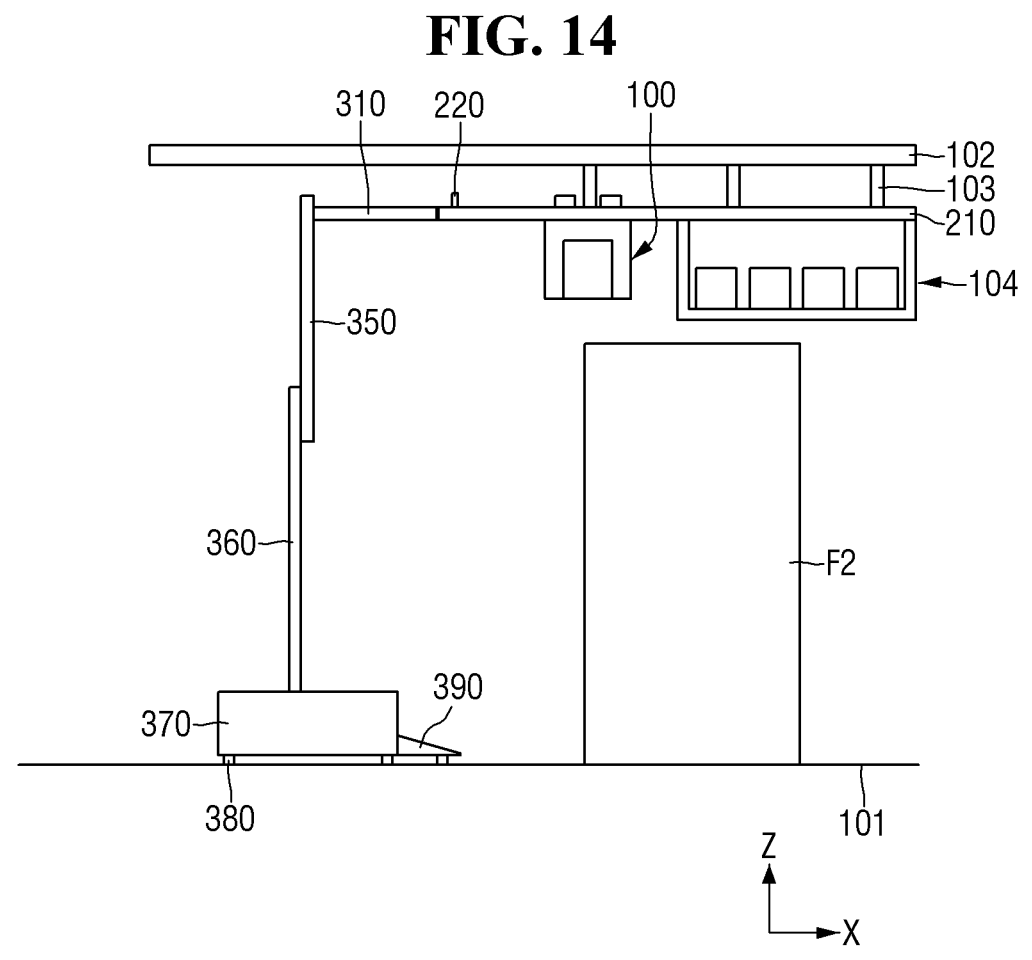

Referring to FIG. 14, as the lifting unit 300 descends, the lifting unit 300 and the stopper 220 may be in contact with each other to open the stopper 220.

Referring to FIG. 19B, the opening of the stopper 220 may be checked by the contact between the lifting unit 300 and the stopper 220. For example, docking of the lifting unit 300 and the stopper 220 may be checked with the naked eye by the worker, but the disclosure is not limited thereto.

When it is not checked that the stopper 220 is in the open state, the ascending/descending portion 350 may ascend again in the vertical direction Z toward the ceiling surface 102 until the stopper 220 is sensed by the first sensor 341, so that the position thereof may be readjusted.

When it is checked that the stopper 220 is in the open state, the ascending/descending portion 350 may descend in the vertical direction Z toward the bottom surface 101 until the stopper 220 is sensed by the second sensor 342.

Figure 15:
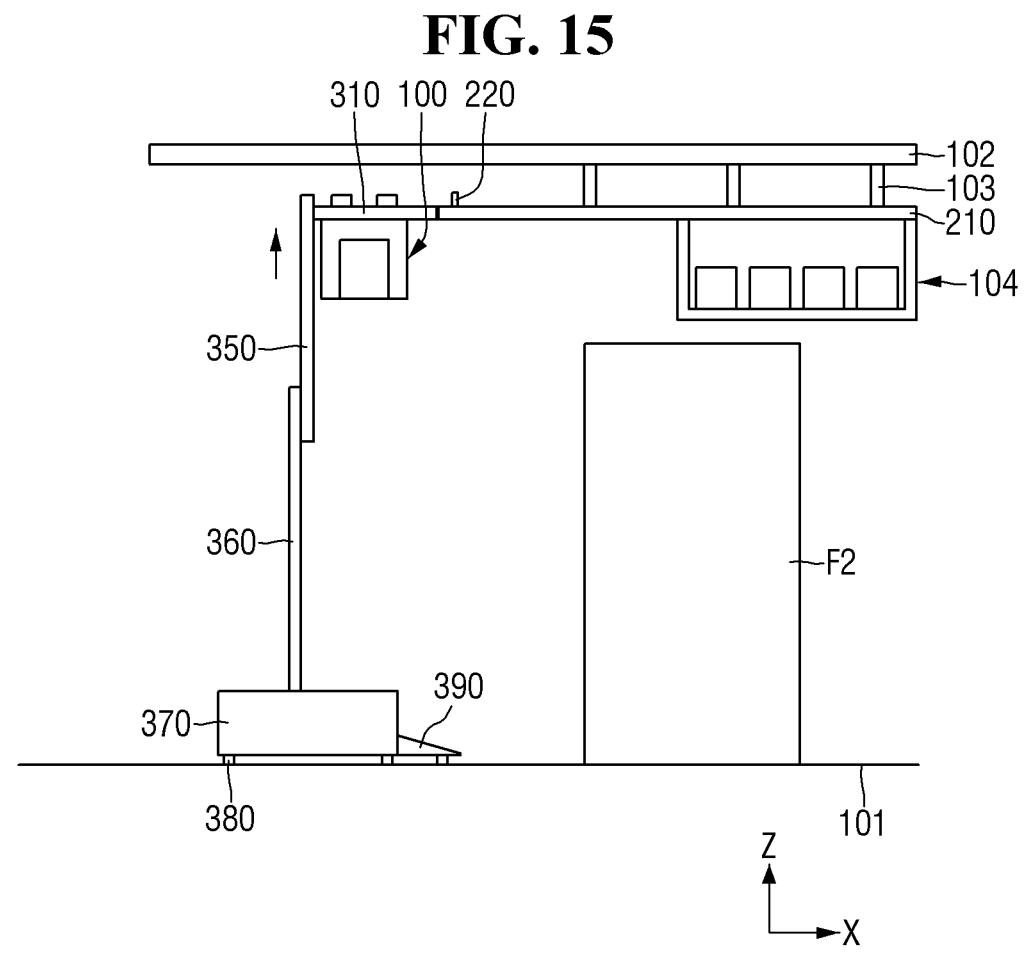

Referring to FIGS. 15 and 19B, the substrate transfer unit 100 in which a failure occurs may be taken out from rail unit 200 by the lifting unit 300. For example, the substrate transfer unit 100 in which a failure occurs may move to the lifting unit 300 by being directly pulled or pushed by the worker, but the disclosure is not limited thereto.

In this case, the ascending/descending portion 350 ascends so that the stopper open block 320 and the stopper 220 are spaced apart from each other, whereby the stopper 220 is closed.

Referring to FIG. 19C, it is possible to determine whether the substrate transfer unit 100 has completely entered the lifting unit 300 (C).

When the substrate transfer unit 100 has completely entered the lifting unit 300, the ascending/descending portion 350 may ascend in the vertical direction Z until the substrate transfer unit 100 is sensed by the first sensor 341.

When the substrate transfer unit 100 has not completely entered the lifting unit 300, the worker may directly pull or push the substrate transfer unit 100 to move to the lifting unit 300.

In addition, as the lifting unit 300 ascends, the lifting unit 300 and the stopper 220 may be spaced apart from each other to close the stopper 220. In detail, as the stopper open block 320 ascends, the stopper 220 may be closed.

Referring to FIG. 19C, it is possible to determine whether the stopper 220 is in a closed state.

When it is not checked that the stopper 220 is in the closed state, the ascending/descending portion 350 may descend or ascend to readjust its position, so that the state of the stopper 220 may be checked again.

Figure 16:
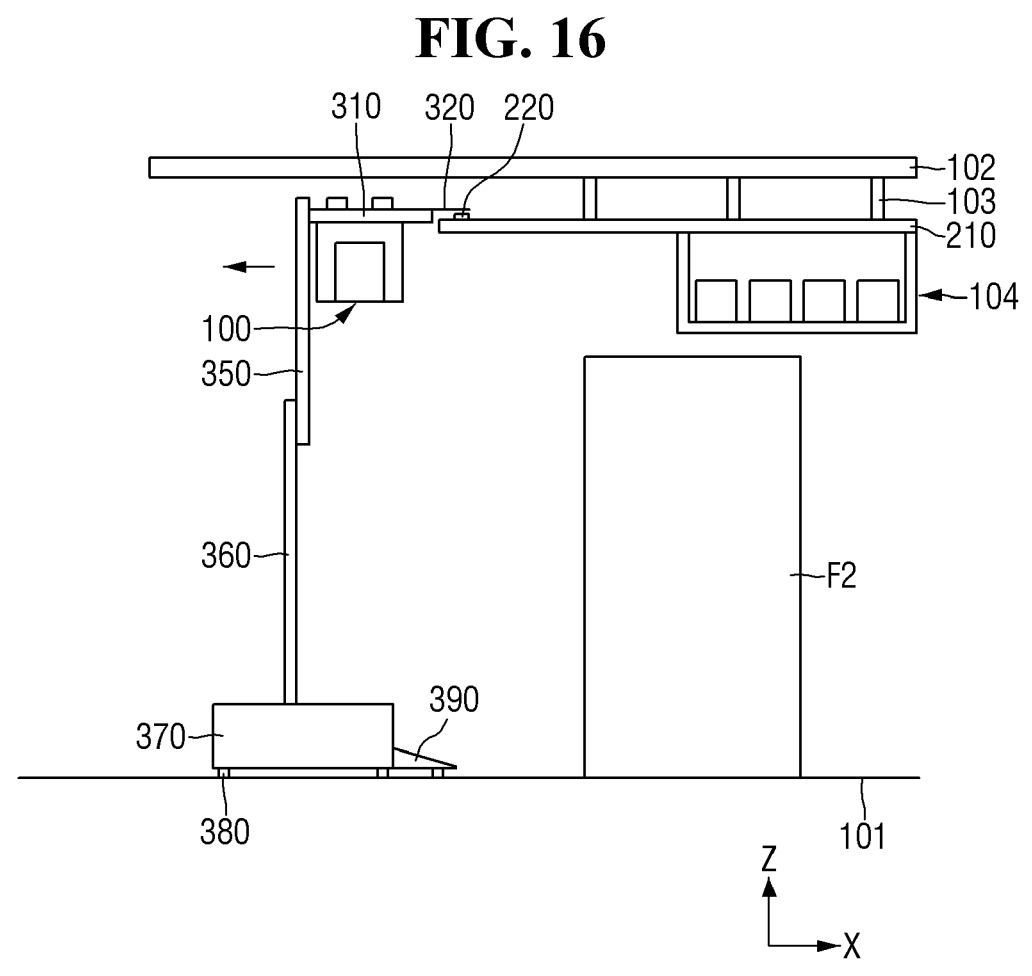

When it is checked that the stopper 220 is in the closed state, as shown in FIG. 16, the fixing portion 390 may be released and the lifting unit 300 may move from the second point EP in a direction parallel with the first direction X.

Figure 17:
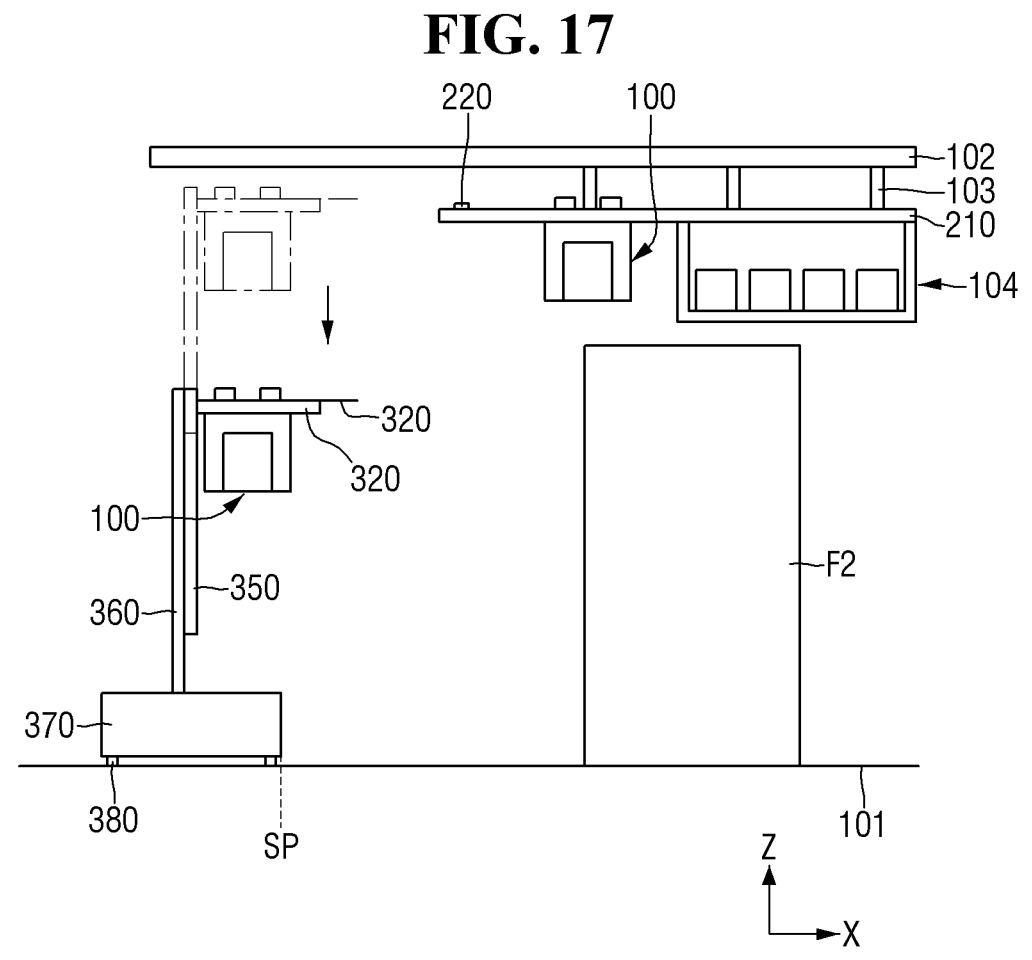

Referring to FIG. 17, after the lifting unit 300 moves backward from the second point EP to the first point SP, the lifting unit 300 may descend to reach a predetermined height. Referring to FIG. 19C, the predetermined height may refer to a position of a lifter home on the body portion 370.

Figure 18:
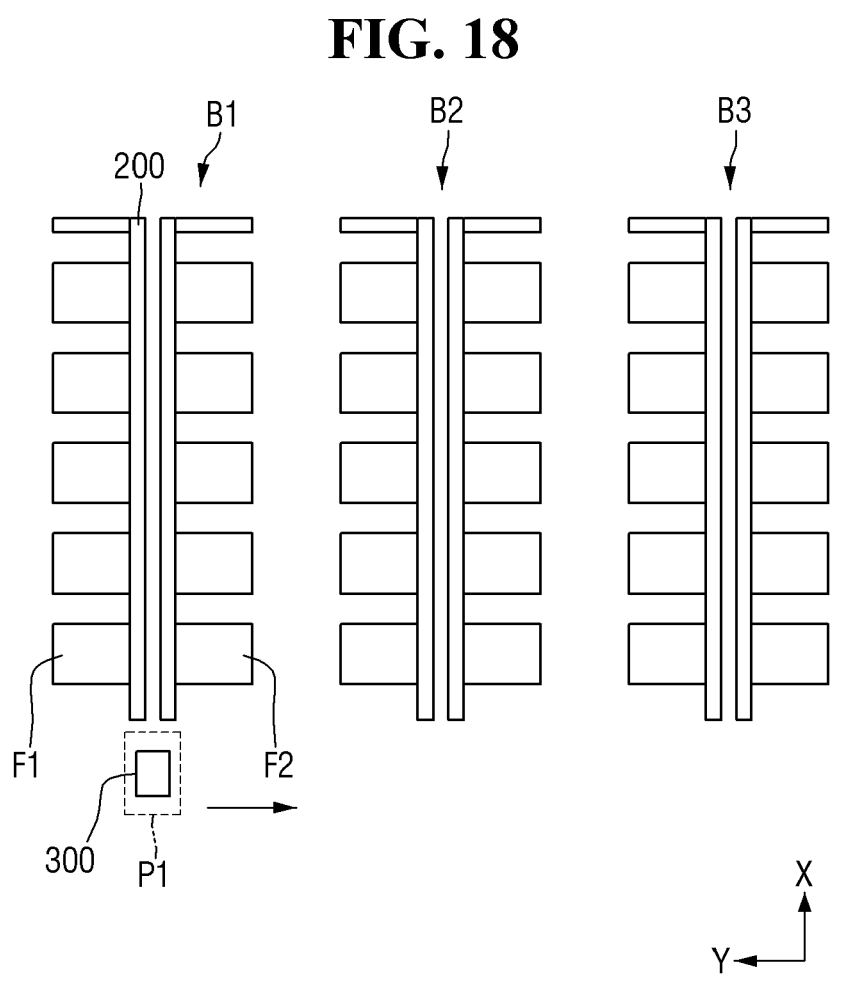

Referring to FIG. 18, the lifting unit 300 may move to an inspection place of the substrate transfer unit 100. Therefore, maintenance and repair may be performed for the substrate transfer unit 100 in which a failure occurs.

According to some embodiments, as a maintenance lifting unit 300 movable in a horizontal direction and/or a vertical direction is used, the maintenance lifting unit 300 may be directly in contact with the rail unit 200. As a result, maintenance and repair may be more efficiently performed for the substrate transfer unit 100 in which a failure occurs.

Although the embodiments of the present disclosure have been described with reference to the accompanying drawings, it will be apparent to those skilled in the art that the present disclosure can be embodied in various forms without being limited to the above-described embodiments and can be embodied in other specific forms without departing from the scope of the present disclosure. Thus, the above embodiments are to be considered in all respects as illustrative and not restrictive.

What is claimed is:

1. An apparatus for manufacturing a semiconductor device, the apparatus comprising:
   a carrier configured to transfer a substrate;
   a rail unit including a driving rail extending in a first direction that the carrier moves and a stopper on a side of the driving rail in a second direction crossing the first direction; and
   a maintenance lift configured to move in the first direction and a third direction perpendicular to the first and second directions to remove the carrier from the rail unit,
   wherein the maintenance lift is configured to ascend in the third direction toward the driving rail, and
   wherein the maintenance lift is configured to descend in the third direction to contact the stopper to move the stopper from a closed state to an open state.

2. The apparatus of claim 1, wherein the rail unit further includes a position adjustment block configured to adjust a position where the stopper and the maintenance lift are in contact,
   the maintenance lift includes a position adjustment pin configured to adjust a contact position with the stopper, and
   the position adjustment pin is received at the position adjustment block as the maintenance lift moves in the first direction.

3. The apparatus of claim 2, wherein the position adjustment block includes a concave portion recessed in the first direction, and
   the position adjustment pin is received in the concave portion as the maintenance lift moves in the first direction.

4. The apparatus of claim 2, wherein the maintenance lift further includes a stopper open block configured to open the stopper in contact with the stopper, and a stopper open block support supporting the stopper open block, and
   as the maintenance lift descends in the third direction, the stopper open block contacts the stopper to open the stopper.

5. The apparatus of claim 1, wherein the maintenance lift includes a first sensor configured to sense a height when ascending in the third direction and a second sensor configured to sense a height when descending in the third direction.

6. The apparatus of claim 1, wherein, when the stopper and the maintenance lift are in contact with each other, the maintenance lift is configured to remove the carrier from the rail unit.

7. The apparatus of claim 1, wherein the rail unit is further configured to support a cable supplying a power source to the carrier, and the rail unit further comprises a stopper support configured to support the stopper on a side of the driving rail.

8. The apparatus of claim 1, wherein the maintenance lift further includes a first frame configured to move in the third direction, a second frame supporting the first frame, and a wheel below the second and configured to move the first frame in the first direction, wherein the second frame is configured to be fixed in place.

9. The apparatus of claim 1, further comprising a first controller configured to control movement of the maintenance lift.

10. The apparatus of claim 1, further comprising a second controller configured to control movement of the carrier.

11. An apparatus for maintenance and repair of equipment in an apparatus for manufacturing a semiconductor device, the apparatus comprising:
   a ceiling-mounted motor configured to transfer a carrier in which a substrate is accommodated;
   a rail system including a driving rail extending in a first horizontal direction that the ceiling-mounted motor moves the carrier, a position adjustment block at an end portion of the driving rail in the first horizontal direction and first and second stoppers on opposite sides of the driving rail to face each other in a second horizontal direction crossing the first horizontal direction;
   a maintenance lift configured to remove the carrier from the rail system and including a position adjustment pin and a stopper open block; and
   a controller configured to control movement of the maintenance lift,
   wherein the position adjustment pin is received at the position adjustment block in the first horizontal direction with the stopper open block being farther along the driving rail than the position adjustment pin in the first horizontal direction and the stopper open block moves in a third direction perpendicular to the first and second horizontal directions to contact the first and second stoppers.

12. The apparatus of claim 11, wherein the position adjustment pin moves in the first horizontal direction to be received at the position adjustment block.

13. The apparatus of claim 11, wherein the stopper open block descends in the third direction to open the first and second stoppers.

14. The apparatus of claim 11, wherein the maintenance lift further includes a first sensor configured to sense an ascending height in the third direction and a second sensor configured to sense a descending height in the third direction.

15. The apparatus of claim 11, wherein the controller is configured to control movement of the maintenance lift in the first and second horizontal directions.

16. The apparatus of claim 11, wherein the controller is configured to control movement of the maintenance lift in the third direction.

17. A method for manufacturing a semiconductor device using an apparatus for manufacturing a semiconductor device, which comprises a rail unit including a stopper and a position adjustment block, a carrier for driving along a ceiling surface and the rail unit, and a maintenance lift for moving the carrier from the ceiling surface to a bottom surface, the method comprising:
   moving the maintenance lift to a first horizontal point where the carrier is positioned;
   ascending the maintenance lift toward the ceiling surface in a vertical direction until the maintenance lift is sensed by a first sensor;
   moving the maintenance lift to a second horizontal point spaced apart from the first horizontal point in a first horizontal direction;
   descending the maintenance lift toward the bottom surface in the vertical direction until the maintenance lift is sensed by a second sensor;
   positioning the maintenance lift to correspond to an upper portion of the position adjustment block;
   descending the maintenance lift so that the maintenance lift and the stopper are in contact with each other to open the stopper; and
   removing the carrier from the rail unit using the maintenance lift.

18. The method of claim 17, further comprising controlling horizontal movement of the maintenance lift.

19. The method of claim 17, further comprising controlling vertical movement of the maintenance lift.

20. The method of claim 17, further comprising:

checking the stopper is open by contact between the stopper and the maintenance lift before removing the carrier from the rail unit using the maintenance lift; and ascending the maintenance lift so that the maintenance lift and the stopper are spaced apart from each other to close the stopper.

* * * * *